United States Patent [19]

Frederiksen et al.

[11] 4,104,547

[45] Aug. 1, 1978

[54] EXTENDED RANGE CURRENT-TO-TIME CONVERTER

[75] Inventors: Thomas M. Frederiksen; Robert S. Sleeth, both of San Jose; William M. Howard, Campbell, all of Calif.

[73] Assignee: National Semiconductor Corporation, Santa Clara, Calif.

[21] Appl. No.: 779,393

[22] Filed: Mar. 21, 1977

[51] Int. Cl.² .................. H03K 5/153; H03K 5/20
[52] U.S. Cl. ........................ 307/362; 307/290; 307/293; 307/296 A; 354/51; 354/60 R
[58] Field of Search ............... 307/350, 362, 290, 296, 307/311, 261, 293; 354/51, 60 R; 328/146

[56] References Cited

FOREIGN PATENT DOCUMENTS 1,957,363 7/1970 Fed. Rep. of Germany ........... 307/362

Primary Examiner—John Zazworsky
Attorney, Agent, or Firm—Gail W. Woodward

[57] ABSTRACT

An improved comparator circuit is employed to respond to the charge on a capacitor which represents the integrated value of an input current. When the charge exceeds the comparator trip point, an output is generated. The output is delayed in time from the onset of the input current by an amount that is almost exactly linearly proportional to the current magnitude. The improvement comprises a circuit that senses the onset of comparator conduction and supplies the current necessary to operate the comparator. At very low input current values a condition can be reached where the current drawn by the comparator input equals or exceeds the applied current. For this condition an ordinary comparator will never trip. The improved circuit prevents this and, since the current added is only to compensate, the timing function is not seriously perturbed.

8 Claims, 2 Drawing Figures

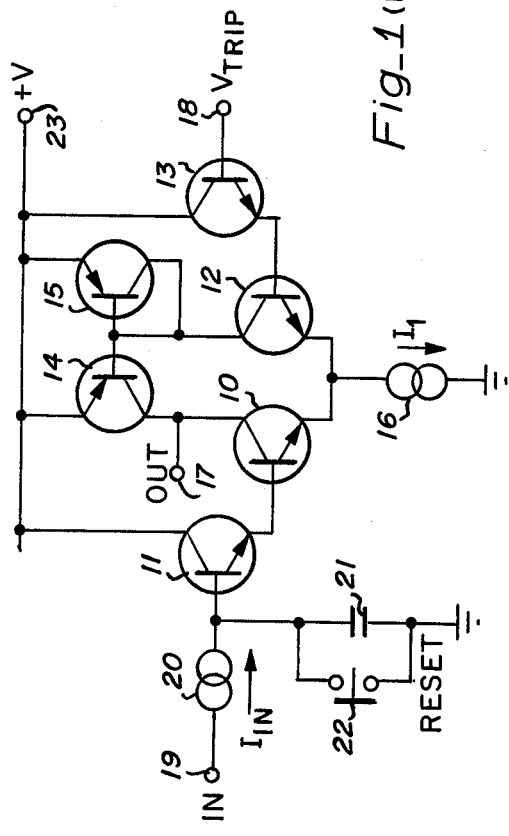
Fig_1 (PRIOR ART)
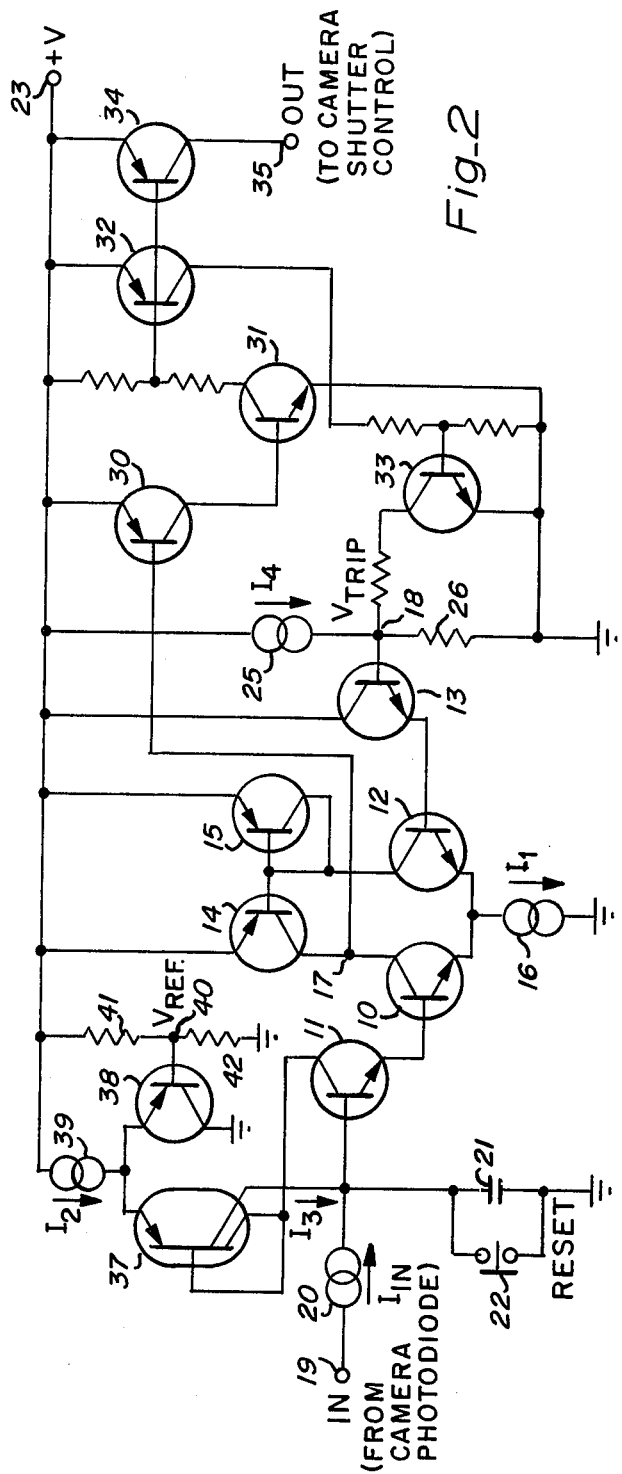
Fig_2

EXTENDED RANGE CURRENT-TO-TIME CONVERTER

BACKGROUND OF THE INVENTION

The invention relates to improving the performance of a comparator circuit. Typically a comparator has a reference input and a signal input. When the signal input exceeds the reference, the circuit generates an output signal. All comparators require that the signal exceed the reference by an increment that represents an error value. Typically this error is reduced to an acceptable value by employing sufficient gain in the comparator amplifying portions. In many applications it is difficult or inconvenient to simply increase gain. For example, if a low supply potential is involved, gain stages cannot be cascaded as desired. Low supply potentials also often mean that low current drain is a desired feature and current starvation is employed. This too acts to reduce transistor gain.

One important use of comparator circuits is in current-to-time transducers. Typically a capacitor is connected across the signal input to a comparator. The current to be sensed is coupled to charge the capacitor. If the applied current is constant, the capacitor charge is a precisely linear rising voltage. When the voltage exceeds the comparator reference voltage, a trip point is reached where an output is produced. Since the voltage rise is linear, the time to trip is a very precise analog of the current. As a practical matter the current need not be constant if the requirement is that the time to trip is the integral of the current. In actual practice the integral of the current can be made to produce a very precisely related time interval over many orders of magnitude.

One large scale use of such circuitry is in the control of automatic cameras. It has been found that silicon photodiodes have a current response to light that is linear from full sunlight to dimly illuminated night scenes. This range can involve 5 to 6 orders of magnitude. Typical photocurrents for reasonable sized elements can range form 10 microamperes to 10 picoamperes. In terms of the time conversion, a 50 pf capacitor will be charged to one volt level in from about 5 seconds at 10 pa to 5 microseconds at 10 microamperes. In the camera control application the photodiode is exposed to the illumination of the scene to be photographed as the shutter is opened. The photocurrent is integrated until the point is reached where the film is properly exposed, whereupon the trip point is reached and the signal from the comparator used to close the shutter. Such control systems have proven to be very effective and car be manufactured using conventional bipolar integrated circuit techniques.

For example, the light to current conversion is shown in the copending application of Dennis M. Monticelli, Ser. No. 707,745, filed July 22, 1976, and titled PHOTODIODE OPERATIONAL AMPLIFIER. The device described in that application will provide a current output linearly related to light level. A photodiode is disclosed that operates in the 7.5 microampere to 100 picoampere range.

When bipolar transistors are used in comparators, leakage currents and base current inputs in the picoampere range are common. Therefore in the prior art many such circuits would not operate reliably at the lower current values. In the worst case, if the current to be integrated is smaller than the input current required to trip the comparator, the comparator will never trip. In the camera control operation this means that the shutter will remain open and the dimly lit scene grossly overexposed.

SUMMARY OF THE INVENTION

It is an object of the invention to provide a bipolar transistor comparator circuit that will time out when the current to be integrated is equal to or smaller than the input current required to trip the comparator.

It is a further object of the invention to provide a bipolar transistor comparator input current compensation circuit that permits adequate circuit performance at low supply voltages.

These and other objects are achieved by compensating the input stage of a bipolar transistor comparator. The collector current of the input transistor is sensed by a differential amplifier, one output of which is coupled to the base of the input transistor. When the input rises to turn the input transistor on, the differential amplifier supplies the required base current so that the input signal, even though smaller than the required base current, can drive the comparator to its trip point.

BRIEF DESCRIPTION OF THE INVENTION

FIG. 1 is a schematic diagram of a prior art comparator connected as a current-to-time converter; and FIG. 2 is a schematic diagram of a current-to-time converter circuit employing the compensating circuit of the invention.

DESCRIPTION OF THE INVENTION

FIG. 1 shows a prior art voltage comparator using six transistors 10 – 15. Transistors 10 and 12 are coupled as a differential amplifier pair with their emitters connected to constant current device 16. Emitter follower amplifiers 11 and 13 drive transistors 10 and 12 respectively. Transistors 14 and 15 are connected as a conventional active load for the differential amplifier and the output appears at terminal 17.

A reference potential is applied to the base of transistor 13 via terminal 18 and is labeled $V_{TRIP}$. Thus the right-hand side of the comparator is the reference side.

The circuit input is applied at terminal 19 and constant current device 20 establishes $I_{IN}$ as the input or the signal current. Capacitor 21 integrates the input current and produces a rising voltage appearing at the base of transistor 11. Thus the left-hand side of the comparator is the signal input side. If a current supply is to be coupled to terminal 19 as a signal source, device 20 can be eliminated.

Reset switch 22 is connected across capacitor 21. Closing switch 22 will discharge capacitor 21 and turn off the left side of the comparator. Opening switch 22 will then initiate the operating cycle. When the left side of the comparator is off, the potential at terminal 17 will be high (close to +V). The time-out signal will be a sharp drop in potential at terminal 17 and this will occur at some time after switch 22 is opened and $I_{IN}$ acts to charge capacitor 21. In practice switch 22 will ordinarily be a transistor type of device toggled by a control voltage.

In operation a selected reference potential called $V_{TRIP}$ is applied to terminal 18. When the charge on capacitor 21 is below $V_{TRIP}$ the right side of the comparator is held on and the left side is held off. As capacitor 21 charges and $V_{TRIP}$ is exceeded, conduction is transferred to the left side of the comparator. The current this causes to flow in the collector of transistor 14 produces a low potential at terminal 17. Thus the output potential at terminal 17 is high while capacitor 21 is charging and goes low as $V_{TRIP}$ is exceeded.

The charge on a capacitor is related by the equation:

$$CV = It \qquad (1)$$

This means that the capacitance-voltage product equals the current-time product. If the current is constant, voltage will be a linear function of time. In terms of magnitude, if capacitor 21 is assumed to be 50 picofarads, a one volt per second ramp will occur at a current level of 50 picoamperes - a very small current by bipolar transistor standards.

If the circuit of FIG. 1 employs a current $I_1$ in source 16 of one microampere and, assuming a Beta or current gain of 100 each in transistors 10 and 11, an input current of 100 picoamperes will be required to turn the left side of the comparator on. Clearly the above-mentioned 50 picoamperes will be insufficient to time-out the FIG. 1 circuit. In operation such a current level would charge capacitor 21 until a voltage is reached where transistor 11 is to be turned on. At this level all of the current will flow into the base of transistor 11 and the voltage will no longer rise. However, the current is not sufficient to turn the left side of the comparator on and the circuit will "hang up". That is, it will never trip.

In the schematic diagram of FIG. 2, the comparator parts that are common to those of FIG. 1 bear the same numbers and operate in the same manner. However, FIG. 2 shows additional circuitry, including that of the invention which will now be described.

$V_{TRIP}$ of circuit node 18 is established at a desired value by current source 25 and resistor 26. In practice the trip point of a production type circuit can be set by programming the value of resistor 26 to compensate for manufacturing variables. The trip voltage at node 18 is made responsive to comparator action to establish a reliable time-out indication. Circuit node 17 is coupled to a cascade amplifier comprising transistors 30 – 33. When node 17 is close to +V, transistors 30 – 33 will all be off. $V_{TRIP}$ will be normal and the circuit ready to operate. At time-out when node 17 goes low, transistors 30 – 33 are all turned on and the voltage at node 18 pulled down by transistor 33. This feedback loop ensures that once the comparator starts to trip, the action is regeneratively forced to completion and reliable performance is assured. Transistor 34 provides output buffer action to terminal 35 by means of an uncommitted collector. Thus at time-out a substantial current is available from +V at terminal 35 and any load connected thereto will not exert any control of time-out operation.

In accordance with the invention, a differential amplifier is coupled to transistor 11. Plural collector transistor 37 and transistor 38 have their emitters coupled through current source 39 to +V. The base of transistor 38 is coupled to node 40 which is labeled $V_{REF}$. $V_{REF}$ is established at some value between +V and $V_{TRIP}$ by means of resistors 41 and 42. Transistor 37 has its base coupled to one of its collectors and the collector of transistor 11. A second collector of transistor 37 is coupled to the base of transistor 11.

As long as the potential at the base of transistor 11 is below $V_{TRIP}$ and transistor 11 is not conducting, transistor 37 will not conduct and the comparator will be unaffected. Current, at the value $I_2$, which is established by source 39, will flow through transistor 38 to ground.

When the voltage across capacitor 21 rises to where transistor 11 starts to conduct, transistor 37 will be turned on. If the area of the collector that is returned to the base of transistor 37 is made larger than the second collector by a ratio equal to the Beta of transistor 11, suitable current will be supplied to the base of transistor 11 from the second collector of transistor 37. Thus zero current from $I_{IN}$ is required to trip the comparator and the capacitor can continue to charge as a function of time and input current even if the input current $I_{IN}$ is smaller than the current required to turn transistor 11 on.

It is preferred that the ratio of collectors in transistor 37 be less than the Beta of transistor 11 if an exact match is not to be achieved. This means that, if anything, time-out will be hastened and hang-up will be avoided. Since transistor Beta will vary with manufacturing variables, it is preferred that the collector ratio in transistor 37 be made equal to the lowest Beta to be encountered in the production spread. Thus in the worst case condition the comparator input will be compensated.

In a typical case, current source 39 will operate to make $I_2$ about 50 nanoamperes whereas $I_1$ is operating at about 1 microampere. A collector ratio of 30 in transistor 37 means that $I_3$ will be about 1.7 nanoamperes. If transistor 11 has a Beta of greater than 30, it cannot hang up and will for the higher values be slightly overcompensated. The comparator of FIG. 2 draws slightly more than one microampere and operates reliably down to 2.3 volts at +V on terminal 23. since this is a dissipation of less than 2½ microwatts, battery operation is readily feasible.

The circuit of FIG. 2 is intended to be for illustration of the invention and not to be limiting in scope. Clearly there are alternatives and equivalents that will occur to a person skilled in the art. Accordingly, it is intended that the invention be limited in scope only by the claims that follow.

We claim:

1. A comparator circuit for sensing the difference between an input potential applied to one side thereof and a reference potential applied to the other side and providing an output when said input potential exceeds said reference potential by a predetermined amount, said comparator circuit comprising:
   a bipolar transistor connected into said one side of said comparator circuit to provide an input for receiving said input potential on the base thereof;
   means for sensing the flow of collector current in said bipolar transistor; and
   means responsive to said collector current for supplying base current to said bipolar transistor, whereby said comparator circuit can be operated from an input source supplying a current that is smaller than the current required by the comparator input bipolar transistor.

2. The comparator circuit of claim 1 wherein said means for supplying base current includes means for ratioing the relation between collector current sensed and base current supplied.

3. The comparator circuit of claim 2 wherein said means for ratioing produces a ratio that approximates the current gain of said bipolar transistor.

4. The comparator circuit of claim 2 wherein said ratio is set to be equal to about the lowest current gain ratio to be expected in said bipolar transistor whereby compensation is achieved in worst case conditions and overcompensation occurs normally.

5. A current-to-time converter circuit comprising:

a capacitor;

means adapted for connection to an input terminal for supplying an analog current to charge said capacitor to produce a voltage thereon;

a voltage comparator having a reference voltage input side coupled to a source of reference voltage, a signal voltage input side coupled to said capacitor, and an output that produces a timeout indication when said capacitor voltage exceeds said reference voltage by a predetermined amount, said signal voltage input side including as an input element a bipolar transistor coupled in base driven configuration into said comparator;

means coupled to the collector of said bipolar transistor for sensing the flow of current therein; and means responsive to said sensing means for supplying base current to said bipolar transistor whereby said base driven transistor does not load said comparator reference voltage input and does not prevent said capacitor from charging at input current levels where said analog current is smaller than said base current.

6. The converter of claim 5 wherein said means for sensing operates at a multiple of said base current.

7. The converter of claim 6 wherein said multiple approximates the current gain of said bipolar transistor.

8. The converter of claim 7 wherein said multiple is made about equal to the lowest current gain to be expected in said bipolar transistor as a result of manufacturing variables.

* * * * *